(12) United States Patent
Barowski et al.

(10) Patent No.: US 10,170,199 B2
(45) Date of Patent: *Jan. 1, 2019

(54) TESTING CONTENT ADDRESSABLE MEMORY AND RANDOM ACCESS MEMORY

(71) Applicant: International Business Machines Corporation, Armonk, NY (US)

(72) Inventors: Harry Barowski, Boeblingen (DE);
Sheldon Levenstein, Austin, TX (US);
Pradip Patel, Poughkeepsie, NY (US);
Daniel Rodko, Poughkeepsie, NY (US);
Gordon B. Sapp, Austin, TX (US);
Rolf Sautter, Bondorf (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/898,893

(22) Filed: Feb. 19, 2018

(65) Prior Publication Data

US 2018/0151248 A1  May 31, 2018

Related U.S. Application Data

(63) Continuation of application No. 15/298,360, filed on Oct. 20, 2016.

(51) Int. Cl.
*G11C 29/40* (2006.01)
*G11C 29/44* (2006.01)
(Continued)

(52) U.S. Cl.
CPC .............. *G11C 29/40* (2013.01); *G11C 15/00* (2013.01); *G11C 29/024* (2013.01); *G11C 29/14* (2013.01);
(Continued)

(58) Field of Classification Search
CPC ..................................................... G11C 29/40
See application file for complete search history.

(56) References Cited

U.S. PATENT DOCUMENTS 6,523,145 B1   2/2003  Ngo et al.
6,993,694 B1 *  1/2006  Kapur ............ G01R 31/318547
                                                    324/527
(Continued)

FOREIGN PATENT DOCUMENTS

EP       1274098 B1    12/2005

OTHER PUBLICATIONS

Bhavsar, "A Built-in Self-Test Method for Write-only Content Addressable Memories," IEEE Computer Society, Proceedings of the 23rd IEEE VLSI Test Symposium (VTS'05), 2005, 6 pages, 1093-0167/05.

(Continued)

*Primary Examiner* — Joseph D Torres
(74) *Attorney, Agent, or Firm* — Peter J. Edwards

(57) ABSTRACT

The present invention provides a system and method of testing CAMs and RAMs. In an exemplary embodiment, the system includes a multiple input signature register (MISR) logically coupled to digital outputs of a CAM, to digital inputs of a RAM, and to digital outputs of an ABIST controller circuit, where the MISR includes a plurality of L1 latch circuits logically coupled to a plurality of L2 latch circuits, a plurality of multiplexer circuits logically coupled to the plurality of L1 latch circuits, a plurality of exclusive or circuits (inner XOR circuits) logically coupled to the plurality of MUX circuits and to the plurality of L2 latch circuits, and at least two XOR circuits (outer XOR circuits), each of the outer XOR circuits logically coupled to one of the inner XOR circuits, to at least one of the MUX circuits, and to at least one of the L2 latch circuits.

1 Claim, 14 Drawing Sheets

(51) Int. Cl.
  *G11C 15/00* (2006.01)
  *G11C 29/02* (2006.01)
  *G11C 29/14* (2006.01)
  *G11C 29/36* (2006.01)

(52) U.S. Cl.
  CPC ...... *G11C 29/44* (2013.01); *G11C 2029/3602* (2013.01)

(56) References Cited

U.S. PATENT DOCUMENTS

| | | | |
|---|---|---|---|
| 7,017,089 B1 | 3/2006 | Huse | |
| 7,346,823 B1 | 3/2008 | Maheshwari et al. | |
| 8,612,814 B1 * | 12/2013 | Tan | G11C 29/52 714/732 |
| 2002/0174393 A1 * | 11/2002 | Udawatta | G01R 31/31853 714/726 |
| 2003/0051197 A1 * | 3/2003 | Evans | G11C 29/12 714/718 |
| 2003/0056164 A1 * | 3/2003 | Lauga | G01R 31/31853 714/726 |
| 2007/0271482 A1 | 11/2007 | Doddamane et al. | |
| 2009/0187799 A1 * | 7/2009 | Jaber | G01R 31/318547 714/727 |
| 2010/0023804 A1 | 1/2010 | Wickeraad et al. | |
| 2011/0307747 A1 | 12/2011 | Duffy et al. | |

OTHER PUBLICATIONS

Grigoryan, et al., "Generic BIST Architecture for Testing of Content Addressable Memories," 2011 IEEE 17th On-Line Testing Symposium, 2011, pp. 86-91, Copyright 2011 IEEE International.

Barowski et al., "Testing Content Addressable Memory and Random Access Memory," U.S. Appl. No. 15/298,360, filed Oct. 20, 2016.

Barowski et al., "Testing Content Addressable Memory and Random Access Memory," U.S. Appl. No. 15/898,861, filed Feb. 19, 2018.

List of IBM Patents or Patent Applications Treated as Related, Dated Feb. 15, 2018, 2 pages.

"Accelerated Examination Support Document," International Business Machines Corporation, Dated Feb. 19, 2018, 23 pages.

* cited by examiner

TESTING CONTENT ADDRESSABLE MEMORY AND RANDOM ACCESS MEMORY

BACKGROUND

The present disclosure relates to computer memory, and more specifically, to testing content addressable memory (CAM) and random access memory (RAM).

SUMMARY

The present invention provides a system and method of testing content addressable memory (CAM) and random access memory (RAM). In an exemplary embodiment, the system includes (1) a multiple input signature register (MISR), where the MISR is logically coupled to digital outputs of a content addressable memory (CAM) (CAM match outputs), is logically coupled to digital inputs of a random access memory (RAM) (RAM inputs), and is logically coupled to digital outputs of an array built-in self-test (ABIST) controller circuit (ABIST outputs), (2) where the MISR includes (a) a plurality of L1 latch circuits logically coupled to a plurality of L2 latch circuits, (b) a plurality of multiplexer (MUX) circuits logically coupled to the plurality of L1 latch circuits, (c) a plurality of exclusive or (XOR) circuits (inner XOR circuits) logically coupled to the plurality of MUX circuits and to the plurality of L2 latch circuits, and (d) at least two XOR circuits (outer XOR circuits), where each of the outer XOR circuits is logically coupled to one of the inner XOR circuits, to at least one of the MUX circuits, and to at least one of the L2 latch circuits, (i) where each of the L1 latch circuits includes a first data input, a first scan input, and a first output, and (ii) where each of the L2 latch circuits includes a second data input, a second scan input, and a second output, (3) where the MISR is logically configured to receive the CAM match outputs on the first data inputs of the L1 latch circuits, (4) where the MISR is logically configured to address the RAM via the first outputs of the L1 latch circuits and the RAM inputs, (5) where the MISR is logically configured to receive the ABIST outputs via the MUX circuits and the inner XOR circuits on the first scan inputs of the L1 latch circuits, (6) where the MISR is logically configured to output compression data (L2 scan out data) via the second outputs of the L2 latch circuits, and (7) where the MISR is logically configured to provide feedback data via the outer XOR circuits. In another embodiment, the MISR is logically coupled to the CAM match outputs, where the CAM is logically coupled to a compare mask circuit, and where the compare mask circuit is logically configured to direct the CAM to output one bit of the CAM match outputs at a time.

In an exemplary embodiment, the method includes (1) receiving digital outputs of a content addressable memory (CAM) (CAM match outputs) on first data inputs of a plurality of L1 latch circuits logically coupled to a plurality of L2 latch circuits, (2) addressing a random access memory (RAM) via first outputs of the L1 latch circuits and digital inputs of the RAM (RAM inputs), (3) receiving digital outputs (ABIST outputs) of an array built-in self-test (ABIST) controller circuit via a plurality of multiplexer (MUX) circuits, logically coupled to the plurality of L1 latch circuits and via a plurality of exclusive or (XOR) circuits (inner XOR circuits) logically coupled to the plurality of MUX circuits and to the plurality of L2 latch circuits, on first scan inputs of the L1 latch circuits, (4) outputting compression data (L2 scan out data) via second outputs of the L2 latch circuits, and (5) providing feedback data via at least two XOR circuits (outer XOR circuits), where each of the outer XOR circuits is logically coupled to one of the inner XOR circuits, to at least one of the MUX circuits, and to at least one of the L2 latch circuits. In another embodiment, the method includes directing, via a compare mask circuit logically coupled to the CAM, the CAM to output one bit of the CAM match outputs at a time.

In an alternative embodiment, the method includes (1) receiving digital outputs of a content addressable memory (CAM) (CAM match outputs) on first data inputs of a plurality of L1 latch circuits logically coupled to a plurality of L2 latch circuits, (2) addressing a random access memory (RAM) via first outputs of the L1 latch circuits and digital inputs of the RAM (RAM inputs), (3) receiving digital outputs (ABIST outputs) of an array built-in self-test (ABIST) controller circuit via a plurality of multiplexer (MUX) circuits, logically coupled to the plurality of L1 latch circuits and via a plurality of exclusive or (XOR) circuits (inner XOR circuits) logically coupled to the plurality of MUX circuits and to the plurality of L2 latch circuits, on first scan inputs of the L1 latch circuits, (4) outputting compression data (L2 scan out data) via second outputs of the L2 latch circuits, (5) providing feedback data via at least two XOR circuits (outer XOR circuits), where each of the outer XOR circuits is logically coupled to one of the inner XOR circuits, to at least one of the MUX circuits, and to at least one of the L2 latch circuits, and (6) directing, via a compare mask circuit logically coupled to the CAM, the CAM to output one bit of the CAM match outputs at a time.

DETAILED DESCRIPTION

Figure 1A:
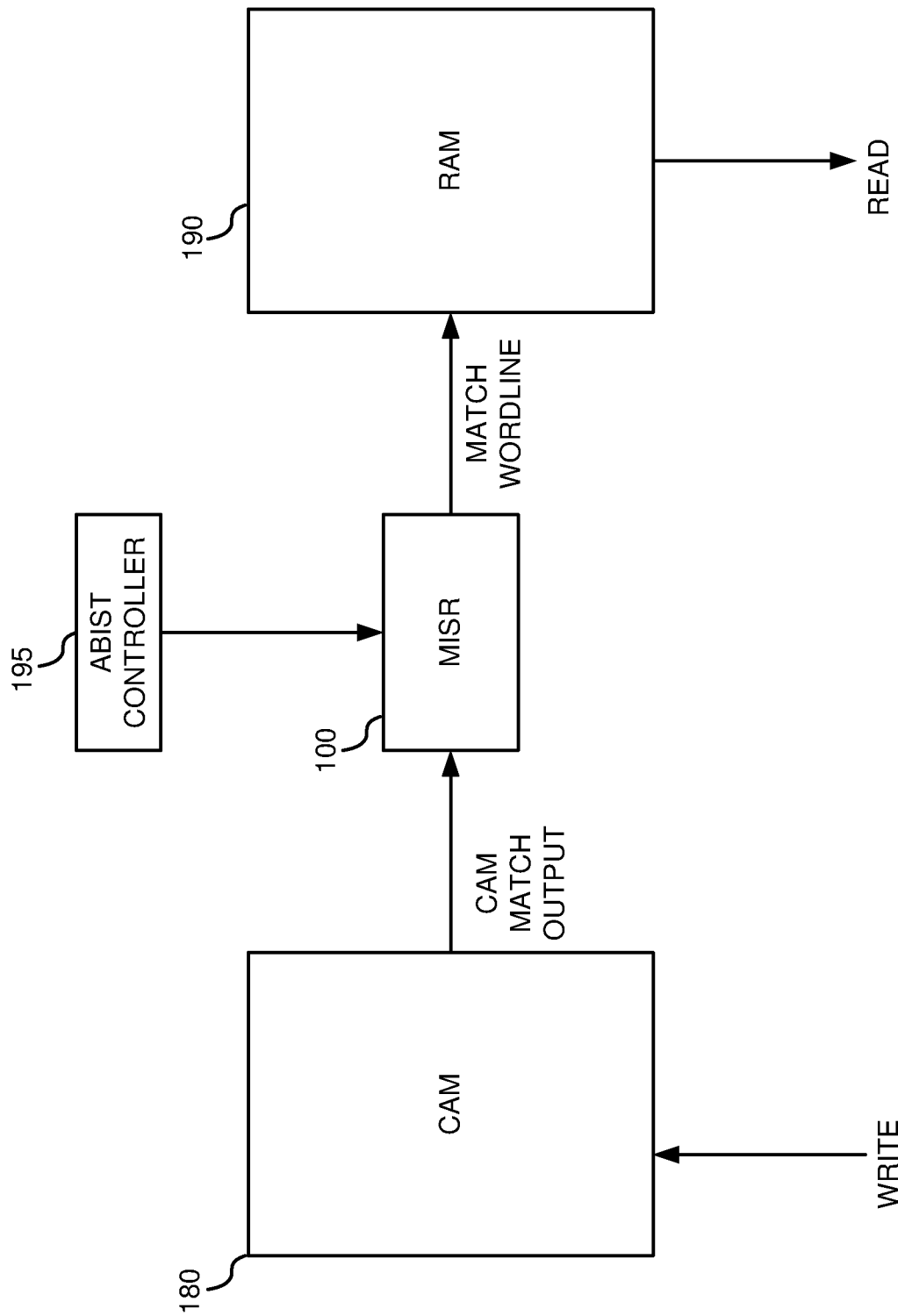
FIG. 1A depicts a block diagram in accordance with an exemplary embodiment of the present invention.

The present invention provides a system and method of testing content addressable memory (CAM) and random access memory (RAM). In an exemplary embodiment, the system includes (1) a multiple input signature register (MISR), where the MISR is logically coupled to digital outputs of a content addressable memory (CAM) (CAM match outputs), is logically coupled to digital inputs of a random access memory (RAM) (RAM inputs), and is logically coupled to digital outputs of an array built-in self-test (ABIST) controller circuit (ABIST outputs), (2) where the MISR includes (a) a plurality of L1 latch circuits logically coupled to a plurality of L2 latch circuits, (b) a plurality of multiplexer (MUX) circuits logically coupled to the plurality of L1 latch circuits, (c) a plurality of exclusive or (XOR) circuits (inner XOR circuits) logically coupled to the plurality of MUX circuits and to the plurality of L2 latch circuits, and (d) at least two XOR circuits (outer XOR circuits), where each of the outer XOR circuits is logically coupled to one of the inner XOR circuits, to at least one of the MUX circuits, and to at least one of the L2 latch circuits, (i) where each of the L1 latch circuits includes a first data input, a first scan input, and a first output, and (ii) where each of the L2 latch circuits includes a second data input, a second scan input, and a second output, (3) where the MISR is logically configured to receive the CAM match outputs on the first data inputs of the L1 latch circuits, (4) where the MISR is logically configured to address the RAM via the first outputs of the L1 latch circuits and the RAM inputs, (5) where the MISR is logically configured to receive the ABIST outputs via the MUX circuits and the inner XOR circuits on the first scan inputs of the L1 latch circuits, (6) where the MISR is logically configured to output compression data (L2 scan out data) via the second outputs of the L2 latch circuits, and (7) where the MISR is logically configured to provide feedback data via the outer XOR circuits. In another embodiment, the MISR is logically coupled to the CAM match outputs, where the CAM is logically coupled to a compare mask circuit, and where the compare mask circuit is logically configured to direct the CAM to output one bit of the CAM match outputs at a time.

In an exemplary embodiment, the method includes (1) receiving digital outputs of a content addressable memory (CAM) (CAM match outputs) on first data inputs of a plurality of L1 latch circuits logically coupled to a plurality of L2 latch circuits, (2) addressing a random access memory (RAM) via first outputs of the L1 latch circuits and digital inputs of the RAM (RAM inputs), (3) receiving digital outputs (ABIST outputs) of an array built-in self-test (ABIST) controller circuit via a plurality of multiplexer (MUX) circuits, logically coupled to the plurality of L1 latch circuits and via a plurality of exclusive or (XOR) circuits (inner XOR circuits) logically coupled to the plurality of MUX circuits and to the plurality of L2 latch circuits, on first scan inputs of the L1 latch circuits, (4) outputting compression data (L2 scan out data) via second outputs of the L2 latch circuits, and (5) providing feedback data via at least two XOR circuits (outer XOR circuits), where each of the outer XOR circuits is logically coupled to one of the inner XOR circuits, to at least one of the MUX circuits, and to at least one of the L2 latch circuits. In another embodiment, the method includes directing, via a compare mask circuit logically coupled to the CAM, the CAM to output one bit of the CAM match outputs at a time.

In an alternative embodiment, the method includes (1) receiving digital outputs of a content addressable memory (CAM) (CAM match outputs) on first data inputs of a plurality of L1 latch circuits logically coupled to a plurality of L2 latch circuits, (2) addressing a random access memory (RAM) via first outputs of the L1 latch circuits and digital inputs of the RAM (RAM inputs), (3) receiving digital outputs (ABIST outputs) of an array built-in self-test (ABIST) controller circuit via a plurality of multiplexer (MUX) circuits, logically coupled to the plurality of L1 latch circuits and via a plurality of exclusive or (XOR) circuits (inner XOR circuits) logically coupled to the plurality of MUX circuits and to the plurality of L2 latch circuits, on first scan inputs of the L1 latch circuits, (4) outputting compression data (L2 scan out data) via second outputs of the L2 latch circuits, (5) providing feedback data via at least two XOR circuits (outer XOR circuits), where each of the outer XOR circuits is logically coupled to one of the inner XOR circuits, to at least one of the MUX circuits, and to at least one of the L2 latch circuits, and (6) directing, via a compare mask circuit logically coupled to the CAM, the CAM to output one bit of the CAM match outputs at a time.

Definitions

Typical computer memory devices include an output capture latch. The output capture latch may be composed of several output latches. The output capture latch captures the output of a memory device, typically one address at a time. An "address" may refer to a row or a column in an array of a memory device. The selection of a particular address in a memory device causes the contents of a row or column to which the particular address refers to be output by the memory device. The contents of the row or column of the memory device are typically output in parallel such that the selection of an address for output causes several bits to output to and to be captured by the output capture latch. The output capture latch may be formed of several individual latches.

Random-access memory (RAM) is a form of computer data storage or a form of a computer memory device. A RAM device allows data items to be read or written in almost the same amount of time irrespective of the physical location of data inside the memory. A RAM contains multiplexing and demultiplexing circuitry to connect data lines of the RAM to addressed storage of the RAM for reading or writing a data entry. Usually, more than one bit of computer data storage is accessed by the same address. In addition, RAM devices often have multiple data lines and are said to be "8-bit", "16-bit", or "32-bit", etc., devices.

Content-addressable memory (CAM) is a special type of computer memory, or computer memory device, used in certain very-high-speed searching applications (e.g., packet forwarding and packet classification in Internet routers). A CAM compares input search data (tag) against a table of stored data, and returns the address of matching data (or in the case of associative memory, the matching data). Unlike standard computer memory (e.g., RAM) in which a memory address is supplied to a RAM and the RAM returns the data word stored at that memory address, a CAM is designed such that when a data word is supplied to the CAM, the CAM searches its entire memory to see if that data word is stored anywhere in it. If the data word is found, the CAM returns a list of one or more storage addresses where the word was found (and in some architectures, it also returns the contents of that storage address, or other associated pieces of data). Thus, a CAM is the hardware embodiment of what in software terms would be called an associative array.

Memory devices may be tested by an Array Built in Self Test (ABIST). The ABIST may be implemented, at least in part, in hardware, as an ABIST circuit. The ABIST sends test patterns to the memory device. The ABIST then causes patterns to be output by the memory device and compares this output to the test patterns. Typically, the determination of memory validity is, at least initially, determined on a per-address basis. An ABIST may send test patterns to computer memory arrays and may perform a compare at the output of the memory against expected ABIST data. Currently, testing a CAM via an ABIST require that latches of a multiple input signature register (MISR) be fed from a cell read port of the CAM, where a multiplexer circuit (MUX) is needed for matching and addressing in a critical path before L1/L2 latches, where the use of the separate read output/port of the CAM requires extra circuitry (i.e., X-coupled NAND gate, fencing, driver) for each bit line of the CAM. Also, currently, testing a RAM via an ABIST requires an additional address decoder circuit to select RAM entries. Currently, testing a CAM and a RAM via an ABIST device bypasses functional match logic of the CAM, thus not testing the functioning or the performance of the functional match logic of the CAM.

A latch is a digital hardware memory element with two Boolean inputs (data and clock) and one Boolean output. For such a latch, when its clock input is a certain value (e.g., a logical 1), the value at its data input will be propagated to its data output (i.e., transparent mode); otherwise, its last propagated value is held at its output. The clock may be modeled as a signal which alternates between 0 and 1 at every time-step. A latch which samples when the clock is a 1 may be denoted as an L1 latch, while a latch which samples when the clock is a 0 may be denoted as an L2 latch. A type of digital design style requires each L1 latch to feed directly to an L2 latch (called a master-slave latch pair), and allow only L2 to drive combinatorial logic.

A multiplexer (or MUX) is a device that selects one of several analog or digital input signals and forwards the selected input into a single line. A MUX of 2n inputs has n select lines, which are used to select which input line to send to the output.

An exclusive or gate (XOR) is a digital logic gate that implements a logical exclusive or function. In other words, an XOR outputs a true output (1/HIGH) if one, and only one, of the inputs to the XOR is true. If both inputs to the XOR are false (0/LOW) or both are true, the XOR outputs a false output (0/LOW).

System

Figure 1B:
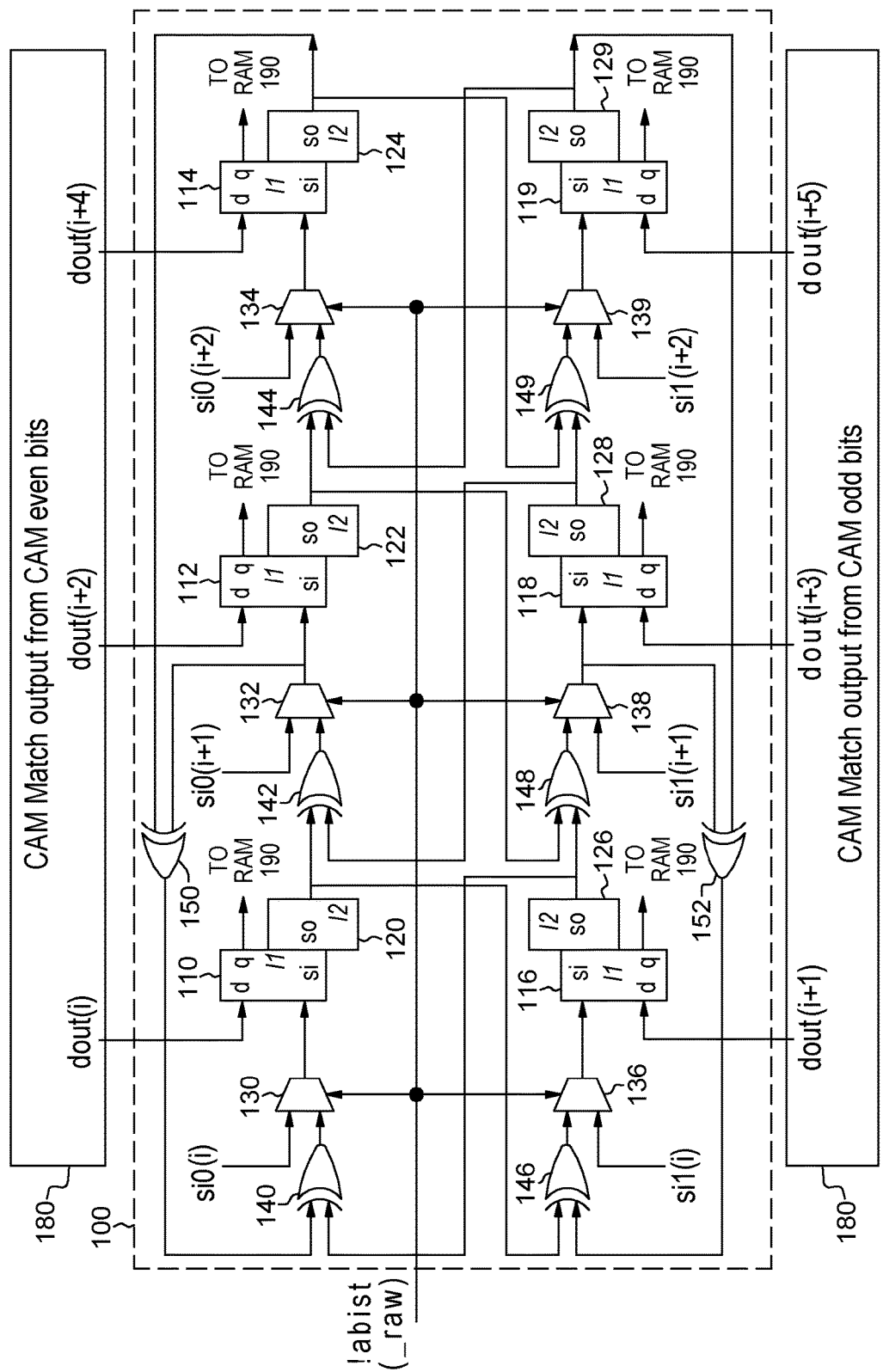
FIG. 1B depicts a block diagram in accordance with an exemplary embodiment of the present invention.
Figure 1C:
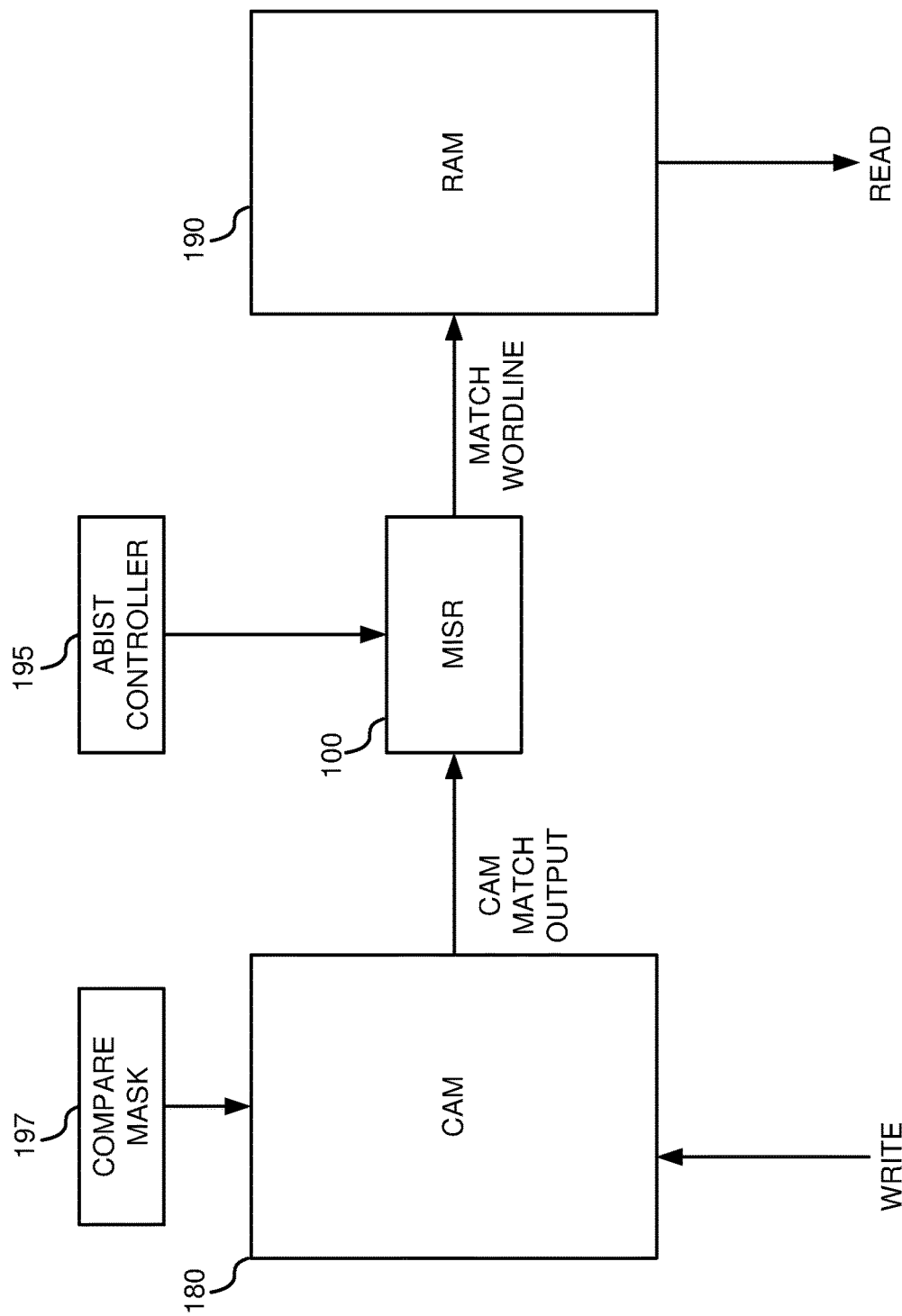
FIG. 1C depicts a block diagram in accordance with an exemplary embodiment of the present invention.

Referring to FIG. 1A and FIG. 1B, in an exemplary embodiment, the present invention provides a system of testing content addressable memory (CAM) and random access memory (RAM). In an exemplary embodiment, the system includes (1) a multiple input signature register (MISR) 100, where MISR 100 is logically coupled to digital outputs of a content addressable memory (CAM) 180 (CAM match outputs), is logically coupled to digital inputs of a random access memory (RAM) 190 (RAM inputs), and is logically coupled to digital outputs of an array built-in self-test (ABIST) controller circuit 195 (ABIST outputs), (2) where MISR 100 includes (a) a plurality of L1 latch circuits 110, 112, 114, 116, 118, 119 logically coupled to a plurality of L2 latch circuits 120, 122, 124, 126, 128, 129, (b) a plurality of multiplexer (MUX) circuits 130, 132, 134, 136, 138, 139 logically coupled to the plurality of L1 latch circuits 110, 112, 114, 116, 118, 119, (c) a plurality of exclusive or (XOR) circuits 140, 142, 144, 146, 148, 149 (inner XOR circuits) logically coupled to the plurality of MUX circuits 130, 132, 134, 136, 138, 139 and to the plurality of L2 latch circuits 120, 122, 124, 126, 128, 129, and (d) at least two XOR circuits 150, 152 (outer XOR circuits), where each of outer XOR circuits 150, 152 is logically coupled to one of the inner XOR circuits 140, 146, to at least one of the MUX circuits 132, 138, and to at least one of the L2 latch circuits 124, 129, (i) where each of L1 latch circuits 110, 112, 114, 116, 118, 119 includes a first data input (e.g., d input), a first scan input (e.g., si input), and a first output (e.g., q output), and (ii) where each of L2 latch circuits 120, 122, 124, 126, 128, 129 includes a second data input, a second scan input (e.g., so), and a second output, (3) where MISR 100 is logically configured to receive the CAM match outputs (e.g., dout(i), dout(i+2), dout(i+4), dout(i+1), dout(i+3), dout(i+5)) on the first data inputs (e.g., d inputs) of L1 latch circuits 110, 112, 114, 116, 118, 119, (4) where MISR 100 is logically configured to address RAM 190 via the first outputs (e.g., q outputs) of L1 latch circuits 110, 112, 114, 116, 118, 119 and the RAM inputs, (5) where MISR 100 is logically configured to receive the ABIST outputs (e.g., si0(i), si0(i+1), si0(i+2), si1(i), si1(i+1), si1(i+2), !abist(_raw)) via MUX circuits 130, 132, 134, 136, 138, 139 and inner XOR circuits 140, 142, 144, 146, 148, 149 on the first scan inputs (e.g., si inputs) of L1 latch circuits 110, 112, 114, 116, 118, 119, (6) where MISR 100 is logically configured to output compression data (L2 scan out data) via the second outputs (e.g., so outputs) of L2 latch circuits 120, 122, 124, 126, 128, 129, and (7) where MISR 100 is logically configured to provide feedback data via outer XOR circuits 150, 152. In an embodiment, the L1 latch circuits 110, 112, 114, 116, 118, 119 capture the CAM match outputs (e.g., dout(i), dout(i+2), dout(i+4), dout(i+1), dout(i+3), dout(i+5)). Referring to FIG. 1C, in another embodiment, MISR 100 is logically coupled to the CAM match outputs, where CAM 180 is logically coupled to a compare mask circuit 197, and where compare mask circuit 197 is logically configured to direct CAM 180 to output one bit of the CAM match outputs at a time.

The present invention is not limited to the number of components depicted in the figures. In an embodiment, the number of the L1 latch circuits, the number of the L2 latch circuits, the number for the MUX circuits, and the number of the inner XOR circuits correspond to and/or equal the number of CAM match outputs. Accordingly, in an embodiment, the number for the L1 latch circuits correspond to and/or equal the number of RAM inputs.

Thus, the present invention does not need to use a cell read port/output of the CAM and does not a multiplexer circuit (MUX) for matching and addressing in a critical path before L1/L2 latches, thereby obviating the use of extra circuitry (i.e., X-coupled NAND gate, fencing, driver) for each bit line of the CAM. In addition, the present invention could test a RAM without using an additional address decoder circuit to select RAM entries. Therefore, the present invention could test functional match logic of a CAM, including testing the functioning and the performance of the functional match logic of the CAM. In addition, the present invention could generate match/hit addresses from the L1 latches. Also, the present invention could test an entire functional path of the CAM (e.g., CAM bitcells, compare data, compare mask input) via use of scan functionality of the L2 latches.

In an embodiment, MISR 100 is logically configured to test MUX circuits 130, 132, 134, 136, 138, and 139 for correct functionality in response to receiving a digital signal from one of the ABIST outputs (e.g., !abist(_raw)).

Method

Figure 2A:
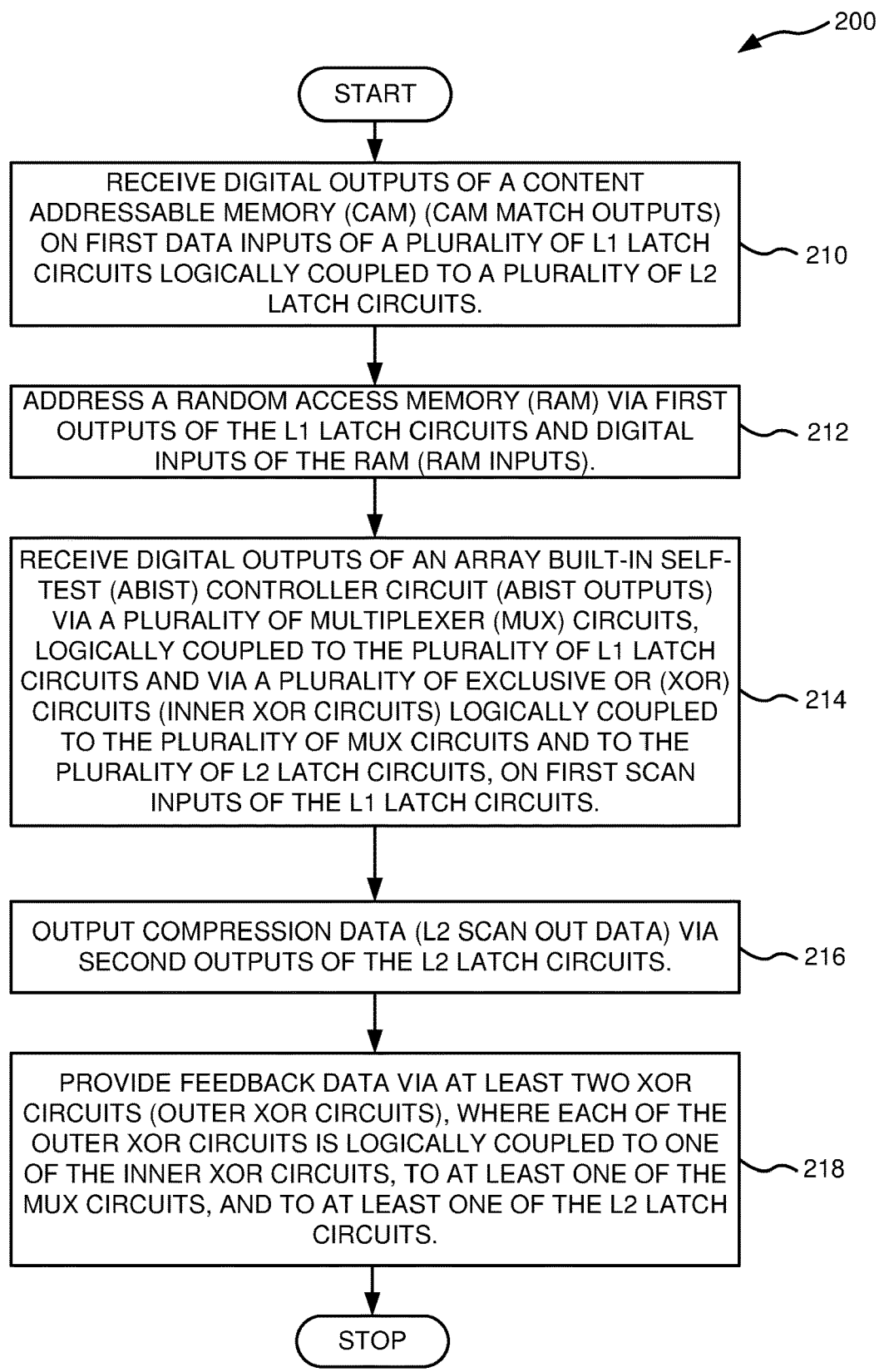
FIG. 2A depicts a flowchart in accordance with an exemplary embodiment of the present invention.
Figure 2B:
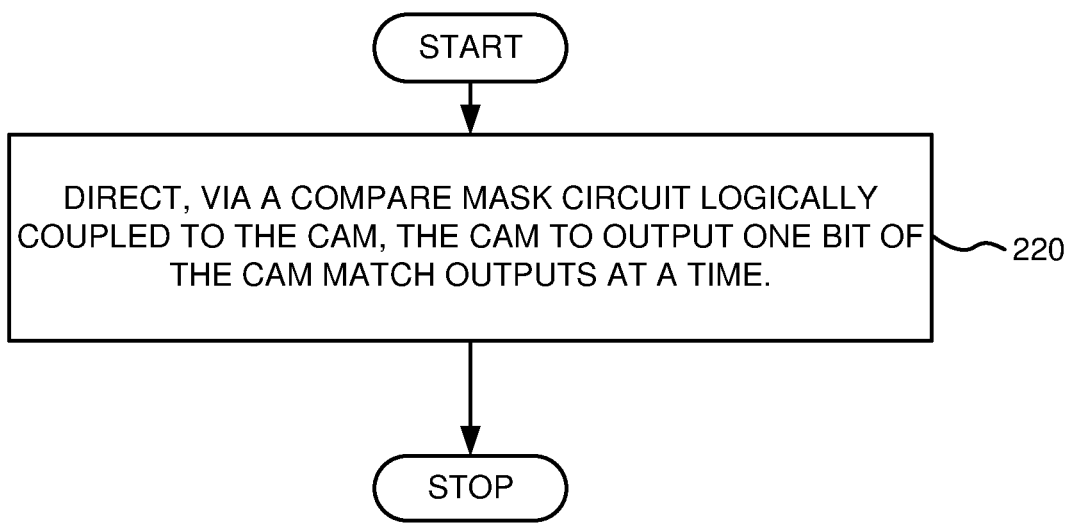
FIG. 2B depicts a flowchart in accordance with an exemplary embodiment of the present invention.

Referring to FIG. 2A, in an exemplary embodiment, the present invention provides a method of testing content addressable memory (CAM) and random access memory (RAM). In an exemplary embodiment, the method includes (1) an operation 210 of receiving digital outputs of a content addressable memory (CAM) (CAM match outputs) on first data inputs of a plurality of L1 latch circuits logically coupled to a plurality of L2 latch circuits, (2) an operation 212 of addressing a random access memory (RAM) via first outputs of the L1 latch circuits and digital inputs of the RAM (RAM inputs), (3) an operation 214 of receiving digital outputs (ABIST outputs) of an array built-in self-test (ABIST) controller circuit via a plurality of multiplexer (MUX) circuits, logically coupled to the plurality of L1 latch circuits and via a plurality of exclusive or (XOR) circuits (inner XOR circuits) logically coupled to the plurality of MUX circuits and to the plurality of L2 latch circuits, on first scan inputs of the L1 latch circuits, (4) an operation 216 of outputting compression data (L2 scan out data) via second outputs of the L2 latch circuits, and (5) an operation 218 of providing feedback data via at least two XOR circuits (outer XOR circuits), where each of the outer XOR circuits is logically coupled to one of the inner XOR circuits, to at least one of the MUX circuits, and to at least one of the L2 latch circuits. Referring to FIG. 2B, in another embodiment, the method includes an operation 220 of directing, via a compare mask circuit logically coupled to the CAM, the CAM to output one bit of the CAM match outputs at a time.

In an embodiment, MISR 100 performs operation 210 of receiving digital outputs of CAM 180 (CAM match outputs) (e.g., dout(i), dout(i+2), dout(i+4), dout(i+1), dout(i+3), dout(i+5)) on first data inputs (e.g., d inputs) of the plurality of L1 latch circuits 110, 112, 114, 116, 118, 119 logically coupled to the plurality of L2 latch circuits 120, 122, 124, 126, 128, 129. In an embodiment, the L1 latch circuits 110, 112, 114, 116, 118, 119 capture the CAM match outputs (e.g., dout(i), dout(i+2), dout(i+4), dout(i+1), dout(i+3), dout(i+5)). In an embodiment, MISR 100 performs operation 212 of addressing RAM 190 via first outputs (e.g., q outputs) of L1 latch circuits 110, 112, 114, 116, 118, 119 and the digital inputs of RAM 190 (RAM inputs). In an embodiment, MISR 100 performs operation 214 of receiving digital outputs (ABIST outputs) (e.g., si0(i), si0(i+1), si0(i+2), si1(i), si1(i+1), si1(i+2), !abist(_raw)) of array built-in self-test (ABIST) controller circuit 195 via the plurality of MUX circuits 130, 132, 134, 136, 138, 139, logically coupled to the plurality of L1 latch circuits 110, 112, 114, 116, 118, 119 and via the plurality of inner XOR circuits 140, 142, 144, 146, 148, 149 logically coupled to the plurality of MUX circuits 130, 132, 134, 136, 138, 139 and to the plurality of L2 latch circuits 120, 122, 124, 126, 128, 129, on first scan inputs (e.g., si inputs) of L1 latch circuits 110, 112, 114, 116, 118, 119. In an embodiment, MISR 100 performs operation 216 of outputting compression data (L2 scan out data) via the second outputs (e.g., so outputs) of L2 latch circuits 120, 122, 124, 126, 128, 129. In an embodiment, MISR 100 performs operation 218 of providing feedback data via outer XOR circuits 150, 152, where each of outer XOR circuits 150, 152 is logically coupled to one of inner XOR circuits 140, 146, to at least one of MUX circuits 132, 138, and to at least one of L2 latch circuits 124, 129.

Figure 2C:
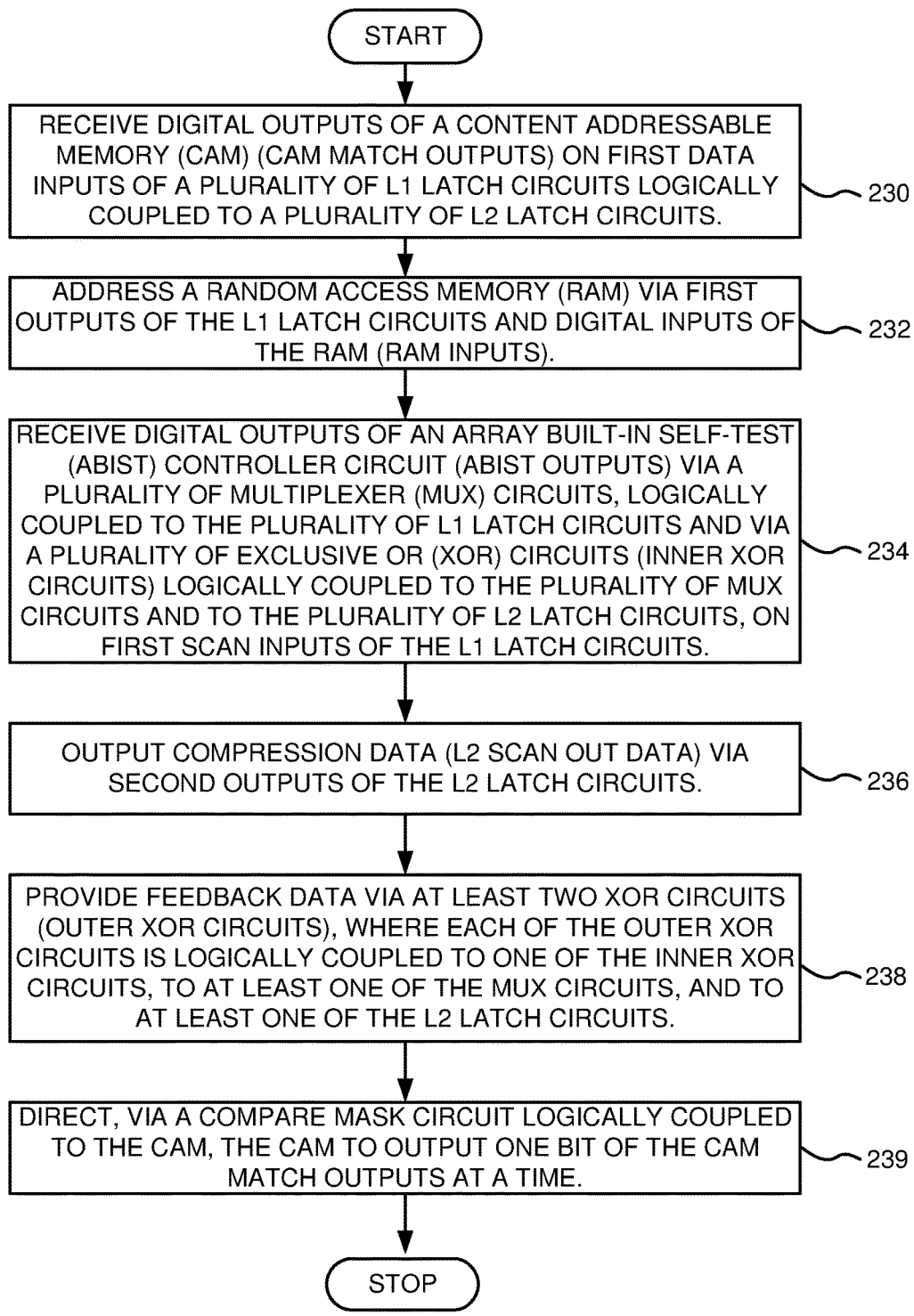
FIG. 2C depicts a flowchart in accordance with an alternative embodiment of the present invention.

Referring to FIG. 2C, in an alternative embodiment, the method includes (1) an operation 230 of receiving digital outputs of a content addressable memory (CAM) (CAM match outputs) on first data inputs of a plurality of L1 latch circuits logically coupled to a plurality of L2 latch circuits, (2) an operation 232 of addressing a random access memory (RAM) via first outputs of the L1 latch circuits and digital inputs of the RAM (RAM inputs), (3) an operation 234 of receiving digital outputs (ABIST outputs) of an array built-in self-test (ABIST) controller circuit via a plurality of multiplexer (MUX) circuits, logically coupled to the plurality of L1 latch circuits and via a plurality of exclusive or (XOR) circuits (inner XOR circuits) logically coupled to the plurality of MUX circuits and to the plurality of L2 latch circuits, on first scan inputs of the L1 latch circuits, (4) an operation 236 of outputting compression data (L2 scan out data) via second outputs of the L2 latch circuits, (5) an operation 238 of providing feedback data via at least two XOR circuits (outer XOR circuits), where each of the outer XOR circuits is logically coupled to one of the inner XOR circuits, to at least one of the MUX circuits, and to at least one of the L2 latch circuits, and (6) an operation 239 of directing, via a compare mask circuit logically coupled to the CAM, the CAM to output one bit of the CAM match outputs at a time.

In an embodiment, the method further includes testing MUX circuits 130, 132, 134, 136, 138, and 139 for correct functionality in response to receiving a digital signal from one of the ABIST outputs (e.g., !abist(_raw)).

RAM Testing

In an exemplary embodiment, MISR 100 is further logically configured, in response to receiving a digital control input signal, to address RAM 190 via the first outputs (e.g., d inputs) of L1 latch circuits 110, 112, 114, 116, 118, 119 and the RAM inputs and via CAM match wordlines on the first outputs (e.g., q outputs) of L1 latch circuits 110, 112, 114, 116, 118, 119, where the CAM match wordlines correspond to the CAM match outputs (e.g., dout(i), dout(i+2), dout(i+4), dout(i+1), dout(i+3), dout(i+5)). In an embodiment, the L1 latch circuits 110, 112, 114, 116, 118, 119 generate the CAM match wordlines/RAM read wordlines in response to capturing the CAM match outputs (e.g., dout(i), dout(i+2), dout(i+4), dout(i+1), dout(i+3), dout(i+5)). In an embodiment, the digital control input signal comprises a digital clock signal.

Figure 3:
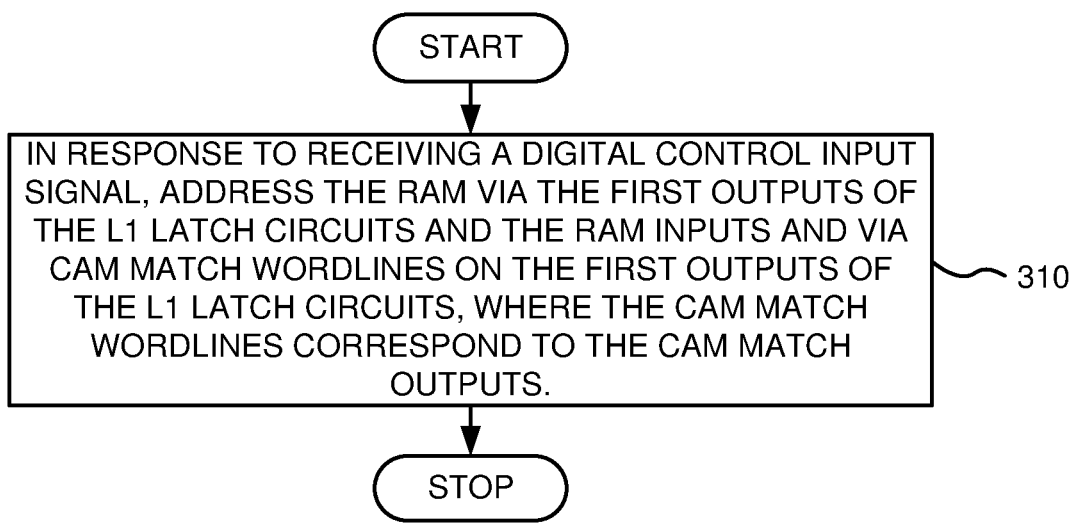
FIG. 3 depicts a flowchart in accordance with an exemplary embodiment of the present invention.

Referring to FIG. 3, in an exemplary embodiment, addressing operation 212 includes an operation 310 of, in response to receiving a digital control input signal, addressing the RAM via the first outputs of the L1 latch circuits and the RAM inputs and via CAM match wordlines on the first outputs of the L1 latch circuits, where the CAM match wordlines correspond to the CAM match outputs. In an embodiment, MISR 100 performs operation 310 of, in response to receiving a digital control input signal, addressing RAM 190 via the first outputs (e.g., d inputs) of L1 latch circuits 110, 112, 114, 116, 118, 119 and the RAM inputs and via CAM match wordlines on the first outputs (e.g., q outputs) of L1 latch circuits 110, 112, 114, 116, 118, 119, where the CAM match wordlines correspond to the CAM match outputs (e.g., dout(i), dout(i+2), dout(i+4), dout(i+1), dout(i+3), dout(i+5)). In an embodiment, the digital control input signal comprises a digital clock signal. In an embodiment, the digital clock signal is generated in response to MISR 100 receiving a digital signal from one of the ABIST outputs.

CAM Testing

Even CAM Match Data

In an exemplary embodiment, MISR 100 is further logically configured, in response to receiving a first type of digital signal from one of the ABIST outputs (e.g., ABIST_PORT_SEL), to test even numbered CAM match outputs (even CAM match data) (e.g., dout(i), dout(i+2), dout(i+4)) among the CAM match outputs against a first set of the ABIST outputs (e.g., si0(i), si0(i+1), si0(i+2)). In an embodiment, the first type of digital signal from the one of the ABIST outputs (e.g., ABIST_PORT_SEL) is a digital 0 signal. In a further embodiment, MISR 100 is logically configured to capture the even CAM match data (e.g., dout(i), dout(i+2), dout(i+4)) via a first set of the L1 latch circuits 110, 112, 114 and a first set of the L2 latch circuits 120, 122, 124, in response to receiving a first set of digital clock signals, and MISR is logically configured to load the captured even CAM match data (e.g., dout(i), dout(i+2), dout(i+4)) into a second set of the L1 latch circuits 116, 118, 119 and a second set of the L2 latch circuits 126, 128, 129, in response to receiving a second set of digital clock signals.

In an exemplary embodiment, MISR 100 is logically configured to capture the even CAM match data (e.g., dout(i), dout(i+2), dout(i+4)) via a first set of the L1 latch circuits 110, 112, 114 and a first set of the L2 latch circuits 120, 122, 124, in response to receiving a first set of digital clock signals, and MISR is logically configured to load the captured even CAM match data (e.g., dout(i), dout(i+2), dout(i+4)) into a second set of the L1 latch circuits 116, 118, 119 and a second set of the L2 latch circuits 126, 128, 129, in response to receiving a second set of digital clock signals.

In an embodiment, the first set of digital clock signals are generated in response to MISR 100 receiving a first type of digital signal from one of the ABIST outputs (e.g., ABIST_PORT_SEL). In an embodiment, the second set of digital clock signals are generated in response to MISR 100 receiving a first type of digital signal from one of the ABIST outputs (e.g., ABIST_PORT_SEL). In an embodiment, MISR 100 generates the first set of digital clock signals via digital clock circuitry. In an embodiment, MISR 100 generates the second set of digital clock signals via digital clock circuitry. In an embodiment, the first type of digital signal from the one of the ABIST outputs (e.g., ABIST_PORT_SEL) is a digital 0 signal.

Figure 4A:
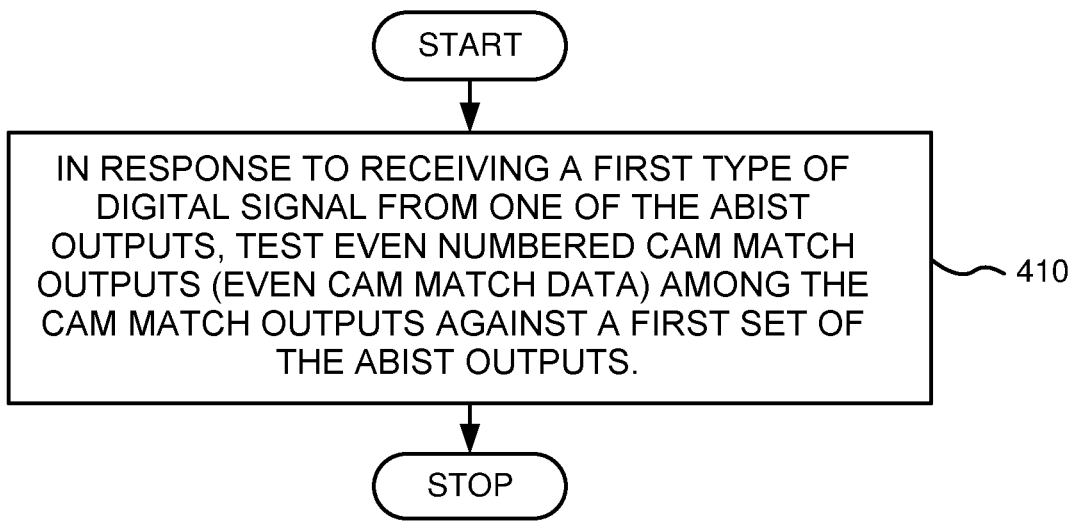
FIG. 4A depicts a flowchart in accordance with a further embodiment of the present invention.

Referring to FIG. 4A, the method further includes an operation 410 of, in response to receiving a first type of digital signal from one of the ABIST outputs, testing even numbered CAM match outputs (even CAM match data) among the CAM match outputs against a first set of the ABIST outputs. In an embodiment, the first type of digital signal from the one of the ABIST outputs is a digital 0 signal. In an embodiment, MISR 100 performs operation 410 of, in response to receiving a first type of digital signal from one of the ABIST outputs (e.g., ABIST_PORT_SEL), testing even numbered CAM match outputs (even CAM match data) (e.g., dout(i), dout(i+2), dout(i+4)) among the CAM match outputs against a first set of the ABIST outputs (e.g., si0($i$), si0($i$+1), si0($i$+2)). In an embodiment, the first type of digital signal from the one of the ABIST outputs (e.g., ABIST_PORT_SEL) is a digital 0 signal.

In a further embodiment, testing operation 410 includes capturing the even CAM match data via a first set of the L1 latch circuits and a first set of the L2 latch circuits, in response to receiving a first set of digital clock signals, and loading the captured even CAM match data into a second set of the L1 latch circuits and a second set of the L2 latch circuits, in response to receiving a second set of digital clock signals. In an embodiment, MISR 100 captures the even CAM match data (e.g., dout(i), dout(i+2), dout(i+4)) via a first set of the L1 latch circuits 110, 112, 114 and a first set of the L2 latch circuits 120, 122, 124, in response to receiving a first set of digital clock signals. In an embodiment, MISR 100 loads the captured even CAM match data (e.g., dout(i), dout(i+2), dout(i+4)) into a second set of the L1 latch circuits 116, 118, 119 and a second set of the L2 latch circuits 126, 128, 129, in response to receiving a second set of digital clock signals.

In an exemplary embodiment, testing operation 410 includes capturing the even CAM match data via a first set of the L1 latch circuits and a first set of the L2 latch circuits, in response to receiving a first set of digital clock signals, and loading the captured even CAM match data into a second set of the L1 latch circuits and a second set of the L2 latch circuits, in response to receiving a second set of digital clock signals. In an embodiment, MISR 100 captures the even CAM match data (e.g., dout(i), dout(i+2), dout(i+4)) via a first set of the L1 latch circuits 110, 112, 114 and a first set of the L2 latch circuits 120, 122, 124, in response to receiving a first set of digital clock signals. In an embodiment, MISR 100 loads the captured even CAM match data (e.g., dout(i), dout(i+2), dout(i+4)) into a second set of the L1 latch circuits 116, 118, 119 and a second set of the L2 latch circuits 126, 128, 129, in response to receiving a second set of digital clock signals.

In an embodiment, the first set of digital clock signals are generated in response to MISR 100 receiving a first type of digital signal from one of the ABIST outputs (e.g., ABIST_PORT_SEL). In an embodiment, the second set of digital clock signals are generated in response to MISR 100 receiving a first type of digital signal from one of the ABIST outputs (e.g., ABIST_PORT_SEL). In an embodiment, MISR 100 generates the first set of digital clock signals via digital clock circuitry. In an embodiment, MISR 100 generates the second set of digital clock signals via digital clock circuitry. In an embodiment, the first type of digital signal from the one of the ABIST outputs (e.g., ABIST_PORT_SEL) is a digital 0 signal.

In an exemplary embodiment, MISR 100 is further logically configured, in response to receiving a first type of digital signal from one of the ABIST outputs (e.g., ABIST_PORT_SEL), to test even numbered CAM match outputs (even CAM match data) (e.g., dout(i), dout(i+2), dout(i+4)) among the CAM match outputs against a first set of the ABIST outputs (e.g., si0($i$), si0($i$+1), si0($i$+2)), one bit of the even CAM match data at a time. In an embodiment, the first type of digital signal from the one of the ABIST outputs (e.g., ABIST_PORT_SEL) is a digital 0 signal. In a further embodiment, MISR 100 is logically configured to capture the even CAM match data (e.g., dout(i), dout(i+2), dout(i+4)) via a first set of the L1 latch circuits 110, 112, 114 and a first set of the L2 latch circuits 120, 122, 124, in response to receiving a first set of digital clock signals, one bit of the even CAM match data at a time, and MISR 100 is logically configured to load the captured even CAM match data (e.g., dout(i), dout(i+2), dout(i+4)) into a second set of the L1 latch circuits 116, 118, 119 and a second set of the L2 latch circuits 126, 128, 129, in response to receiving a second set of digital clock signals, one bit of the even CAM match data at a time.

In an exemplary embodiment, MISR 100 is logically configured to capture the even CAM match data (e.g., dout(i), dout(i+2), dout(i+4)) via a first set of the L1 latch circuits 110, 112, 114 and a first set of the L2 latch circuits 120, 122, 124, in response to receiving a first set of digital clock signals, one bit of the even CAM match data at a time, and MISR 100 is logically configured to load the captured even CAM match data (e.g., dout(i), dout(i+2), dout(i+4)) into a second set of the L1 latch circuits 116, 118, 119 and a second set of the L2 latch circuits 126, 128, 129, in response to receiving a second set of digital clock signals, one bit of the even CAM match data at a time.

In an embodiment, the first set of digital clock signals are generated in response to MISR 100 receiving a first type of digital signal from one of the ABIST outputs (e.g., ABIST_PORT_SEL). In an embodiment, the second set of digital clock signals are generated in response to MISR 100 receiving a first type of digital signal from one of the ABIST outputs (e.g., ABIST_PORT_SEL). In an embodiment, MISR 100 generates the first set of digital clock signals via digital clock circuitry. In an embodiment, MISR 100 generates the second set of digital clock signals via digital clock circuitry. In an embodiment, the first type of digital signal from the one of the ABIST outputs (e.g., ABIST_PORT_SEL) is a digital 0 signal.

Figure 4B:
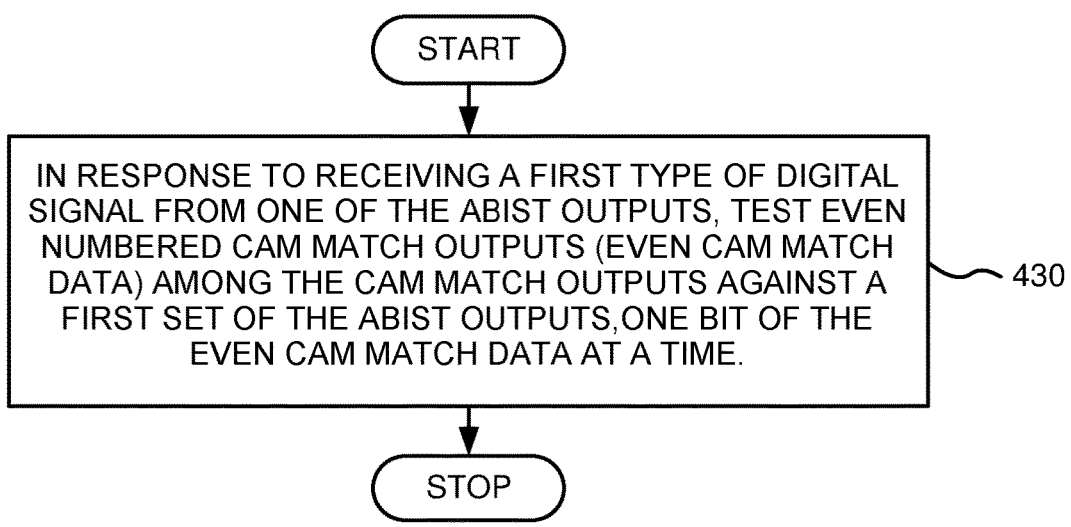
FIG. 4B depicts a flowchart in accordance with a further embodiment of the present invention.

Referring to FIG. 4B, the method further includes an operation 430 of, in response to receiving a first type of digital signal from one of the ABIST outputs, testing even numbered CAM match outputs (even CAM match data) among the CAM match outputs against a first set of the ABIST outputs, one bit of the even CAM match data at a time. In an embodiment, the first type of digital signal from the one of the ABIST outputs is a digital 0 signal. In an embodiment, MISR 100 performs operation 430 of, in response to receiving a first type of digital signal from one of the ABIST outputs (e.g., ABIST_PORT_SEL), testing even numbered CAM match outputs (even CAM match data) (e.g., dout(i), dout(i+2), dout(i+4)) among the CAM match outputs against a first set of the ABIST outputs (e.g., si0(i), si0(i+1), si0(i+2)), one bit of the even CAM match data at a time. In an embodiment, the first type of digital signal from the one of the ABIST outputs (e.g., ABIST_PORT_SEL) is a digital 0 signal.

Figure 4C:
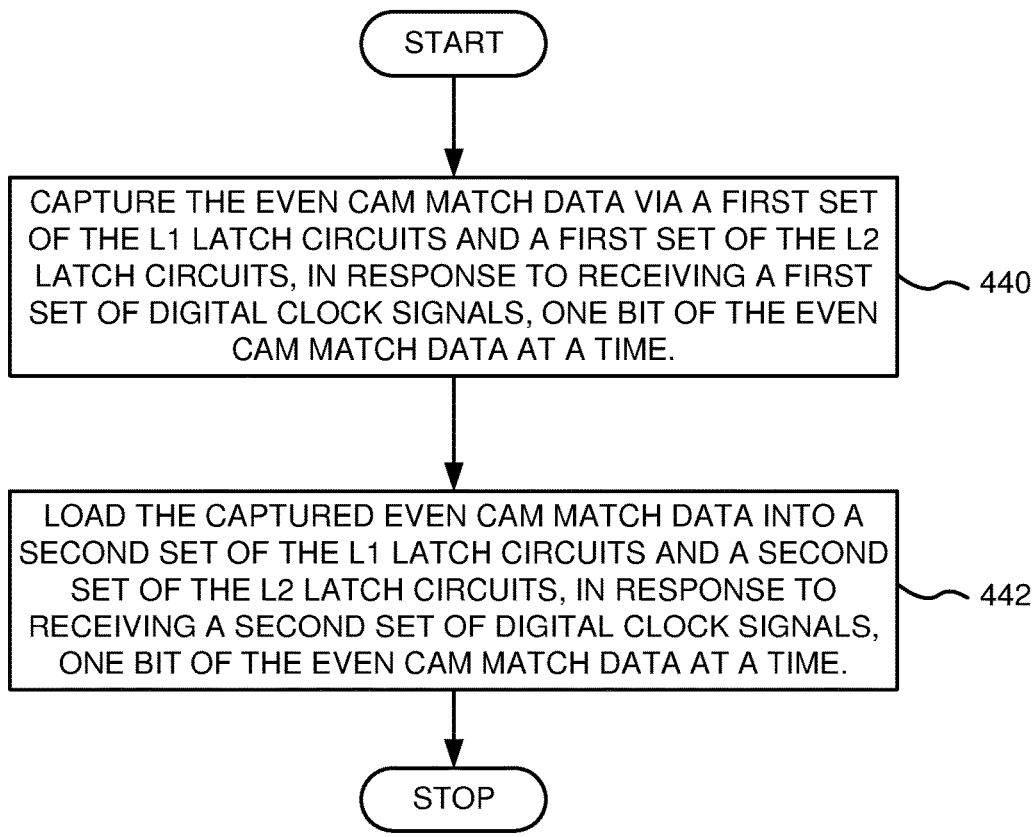
FIG. 4C depicts a flowchart in accordance with a further embodiment of the present invention.

Referring to FIG. 4C, in a further embodiment, testing operation 430 includes an operation 440 of capturing the even CAM match data via a first set of the L1 latch circuits and a first set of the L2 latch circuits, in response to receiving a first set of digital clock signals, one bit of the even CAM match data at a time and an operation 442 of loading the captured even CAM match data into a second set of the L1 latch circuits and a second set of the L2 latch circuits, in response to receiving a second set of digital clock signals, one bit of the even CAM match data at a time. In an embodiment, MISR 100 performs operation 440 of capturing the even CAM match data (e.g., dout(i), dout(i+2), dout(i+4)) via a first set of the L1 latch circuits 110, 112, 114 and a first set of the L2 latch circuits 120, 122, 124, in response to receiving a first set of digital clock signals, one bit of the even CAM match data at a time. In an embodiment, MISR 100 performs operation 442 of loading the captured even CAM match data (e.g., dout(i), dout(i+2), dout(i+4)) into a second set of the L1 latch circuits 116, 118, 119 and a second set of the L2 latch circuits 126, 128, 129, in response to receiving a second set of digital clock signals, one bit of the even CAM match data at a time.

In an exemplary embodiment, testing operation 430 includes an operation 440 of capturing the even CAM match data via a first set of the L1 latch circuits and a first set of the L2 latch circuits, in response to receiving a first set of digital clock signals, one bit of the even CAM match data at a time and an operation 442 of loading the captured even CAM match data into a second set of the L1 latch circuits and a second set of the L2 latch circuits, in response to receiving a second set of digital clock signals, one bit of the even CAM match data at a time. In an embodiment, MISR 100 performs operation 440 of capturing the even CAM match data (e.g., dout(i), dout(i+2), dout(i+4)) via a first set of the L1 latch circuits 110, 112, 114 and a first set of the L2 latch circuits 120, 122, 124, in response to receiving a first set of digital clock signals, one bit of the even CAM match data at a time. In an embodiment, MISR 100 performs operation 442 of loading the captured even CAM match data (e.g., dout(i), dout(i+2), dout(i+4)) into a second set of the L1 latch circuits 116, 118, 119 and a second set of the L2 latch circuits 126, 128, 129, in response to receiving a second set of digital clock signals, one bit of the even CAM match data at a time.

In an embodiment, the first set of digital clock signals are generated in response to MISR 100 receiving a first type of digital signal from one of the ABIST outputs (e.g., ABIST_PORT_SEL). In an embodiment, the second set of digital clock signals are generated in response to MISR 100 receiving a first type of digital signal from one of the ABIST outputs (e.g., ABIST_PORT_SEL). In an embodiment, MISR 100 generates the first set of digital clock signals via digital clock circuitry. In an embodiment, MISR 100 generates the second set of digital clock signals via digital clock circuitry. In an embodiment, the first type of digital signal from the one of the ABIST outputs (e.g., ABIST_PORT_SEL) is a digital 0 signal.

Odd CAM Match Data

In an exemplary embodiment, MISR 100 is further logically configured, in response to receiving a second type of digital signal from one of the ABIST outputs (e.g., ABIST_PORT_SEL), to test odd numbered CAM match outputs (odd CAM match data) (e.g., dout(i+1), dout(i+3), dout(i+5)) among the CAM match outputs against a second set of the ABIST outputs (e.g., si1(i), si1(i+1), si1(i+2)). In an embodiment, the second type of digital signal from the one of the ABIST outputs (e.g., ABIST_PORT_SEL) is a digital 1 signal. In a further embodiment, MISR 100 is logically configured to capture the odd CAM match data (e.g., dout(i+1), dout(i+3), dout(i+5)) via a second set of the L1 latch circuits 116, 118, 119 and a second set of the L2 latch circuits 126, 128, 129, in response to receiving a first set of digital clock signals, and MISR 100 is logically configured to load the captured odd CAM match data (e.g., dout(i+1), dout(i+3), dout(i+5)) into a first set of the L1 latch circuits 110, 112, 114 and a first set of the L2 latch circuits 120, 122, 124, in response to receiving a second set of digital clock signals.

In an exemplary embodiment, MISR 100 is logically configured to capture the odd CAM match data (e.g., dout(i+1), dout(i+3), dout(i+5)) via a second set of the L1 latch circuits 116, 118, 119 and a second set of the L2 latch circuits 126, 128, 129, in response to receiving a first set of digital clock signals, and MISR 100 is logically configured to load the captured odd CAM match data (e.g., dout(i+1), dout(i+3), dout(i+5)) into a first set of the L1 latch circuits 110, 112, 114 and a first set of the L2 latch circuits 120, 122, 124, in response to receiving a second set of digital clock signals.

In an embodiment, the first set of digital clock signals are generated in response to MISR 100 receiving a second type of digital signal from one of the ABIST outputs (e.g., ABIST_PORT_SEL). In an embodiment, the second set of digital clock signals are generated in response to MISR 100 receiving a second type of digital signal from one of the ABIST outputs (e.g., ABIST_PORT_SEL). In an embodiment, MISR 100 generates the first set of digital clock signals via digital clock circuitry. In an embodiment, MISR 100 generates the second set of digital clock signals via digital clock circuitry. In an embodiment, the second type of digital signal from the one of the ABIST outputs (e.g., ABIST_PORT_SEL) is a digital 0 signal.

Figure 5A:
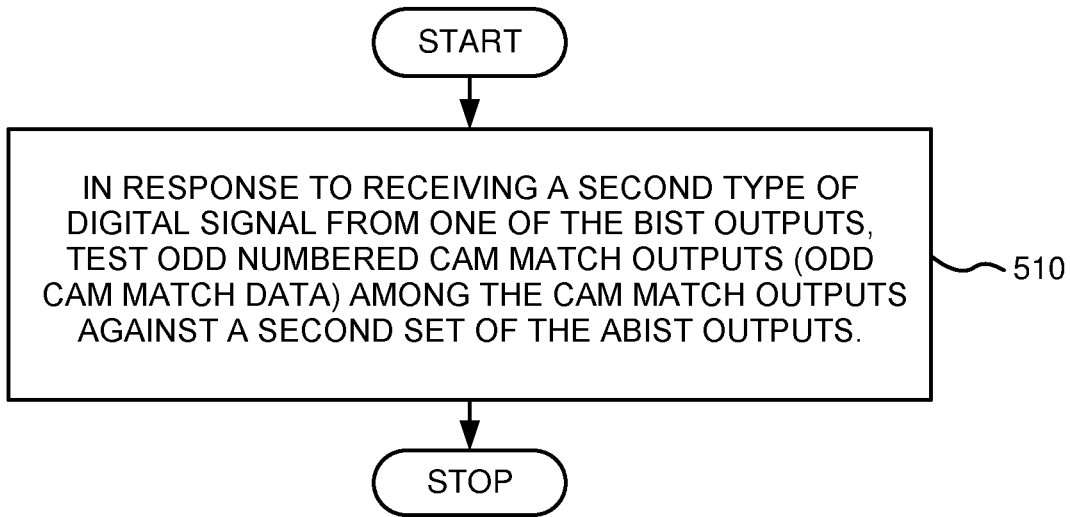
FIG. 5A depicts a flowchart in accordance with a further embodiment of the present invention.

Referring to FIG. 5A, the method further includes an operation 510 of, in response to receiving a second type of digital signal from one of the ABIST outputs, testing odd numbered CAM match outputs (odd CAM match data) among the CAM match outputs against a second set of the ABIST outputs. In an embodiment, the second type of digital signal from the one of the ABIST outputs is a digital 1 signal. In an embodiment, MISR 100 performs operation 510 of, in response to receiving a second type of digital signal from one of the ABIST outputs (e.g., ABIST_PORT_SEL), testing odd numbered CAM match outputs (odd CAM match data) (e.g., dout(i+1), dout(i+3), dout(i+5)) among the CAM match outputs against a second set of the ABIST outputs (e.g., si1(*i*), si1(*i*+1), si1(*i*+2)). In an embodiment, the second type of digital signal from the one of the ABIST outputs (e.g., ABIST_PORT_SEL) is a digital 1 signal.

In a further embodiment, testing operation 510 includes capturing the odd CAM match data via a second set of the L1 latch circuits and a second set of the L2 latch circuits, in response to receiving a first set of digital clock signals and loading the captured CAM odd match data into a first set of the L1 latch circuits and a first set of the L2 latch circuits, in response to receiving a second set of digital clock signals. In an embodiment, MISR 100 captures the odd CAM match data (e.g., dout(i+1), dout(i+3), dout(i+5)) via a second set of the L1 latch circuits 116, 118, 119 and a second set of the L2 latch circuits 126, 128, 129, in response to receiving a first set of digital clock signals. In an embodiment, MISR 100 loads the captured CAM odd match data (e.g., dout(i+1), dout(i+3), dout(i+5)) into a first set of the L1 latch circuits 110, 112, 114 and a first set of the L2 latch circuits 120, 122, 124, in response to receiving a second set of digital clock signals.

In an exemplary embodiment, testing operation 510 includes capturing the odd CAM match data via a second set of the L1 latch circuits and a second set of the L2 latch circuits, in response to receiving a first set of digital clock signals and loading the captured CAM odd match data into a first set of the L1 latch circuits and a first set of the L2 latch circuits, in response to receiving a second set of digital clock signals. In an embodiment, MISR 100 captures the odd CAM match data (e.g., dout(i+1), dout(i+3), dout(i+5)) via a second set of the L1 latch circuits 116, 118, 119 and a second set of the L2 latch circuits 126, 128, 129, in response to receiving a first set of digital clock signals. In an embodiment, MISR 100 loads the captured CAM odd match data (e.g., dout(i+1), dout(i+3), dout(i+5)) into a first set of the L1 latch circuits 110, 112, 114 and a first set of the L2 latch circuits 120, 122, 124, in response to receiving a second set of digital clock signals.

In an embodiment, the first set of digital clock signals are generated in response to MISR 100 receiving a second type of digital signal from one of the ABIST outputs (e.g., ABIST_PORT_SEL). In an embodiment, the second set of digital clock signals are generated in response to MISR 100 receiving a second type of digital signal from one of the ABIST outputs (e.g., ABIST_PORT_SEL). In an embodiment, MISR 100 generates the first set of digital clock signals via digital clock circuitry. In an embodiment, MISR 100 generates the second set of digital clock signals via digital clock circuitry. In an embodiment, the second type of digital signal from the one of the ABIST outputs (e.g., ABIST_PORT_SEL) is a digital 0 signal.

In an exemplary embodiment, MISR 100 is further logically configured, in response to receiving a second type of digital signal from one of the ABIST outputs (e.g., ABIST_PORT_SEL), to test odd numbered CAM match outputs (odd CAM match data) (e.g., dout(i+1), dout(i+3), dout(i+5)) among the CAM match outputs against a second set of the ABIST outputs (e.g., si1(*i*), si1(*i*+1), si1(*i*+2)), one bit of the odd CAM match data at a time. In an embodiment, the first type of digital signal from the one of the ABIST outputs (e.g., ABIST_PORT_SEL) is a digital 1 signal. In a further embodiment, MISR 100 is logically configured to capture the odd CAM match data (e.g., dout(i+1), dout(i+3), dout(i+5)) via a second set of the L1 latch circuits 116, 118, 119 and a second set of the L2 latch circuits 126, 128, 129, in response to receiving a first set of digital clock signals, one bit of the odd CAM match data at a time, and MISR 100 is logically configured to load the captured odd CAM match data (e.g., dout(i+1), dout(i+3), dout(i+5)) into a first set of the L1 latch circuits 110, 112, 114 and a first set of the L2 latch circuits 120, 122, 124, in response to receiving a second set of digital clock signals, one bit of the odd CAM match data at a time.

In an exemplary embodiment, MISR 100 is logically configured to capture the odd CAM match data (e.g., dout(i+1), dout(i+3), dout(i+5)) via a second set of the L1 latch circuits 116, 118, 119 and a second set of the L2 latch circuits 126, 128, 129, in response to receiving a first set of digital clock signals, one bit of the odd CAM match data at a time, and MISR 100 is logically configured to load the captured odd CAM match data (e.g., dout(i+1), dout(i+3), dout(i+5)) into a first set of the L1 latch circuits 110, 112, 114 and a first set of the L2 latch circuits 120, 122, 124, in response to receiving a second set of digital clock signals, one bit of the odd CAM match data at a time.

In an embodiment, the first set of digital clock signals are generated in response to MISR 100 receiving a second type of digital signal from one of the ABIST outputs (e.g., ABIST_PORT_SEL). In an embodiment, the second set of digital clock signals are generated in response to MISR 100 receiving a second type of digital signal from one of the ABIST outputs (e.g., ABIST_PORT_SEL). In an embodiment, MISR 100 generates the first set of digital clock signals via digital clock circuitry. In an embodiment, MISR 100 generates the second set of digital clock signals via digital clock circuitry. In an embodiment, the second type of digital signal from the one of the ABIST outputs (e.g., ABIST_PORT_SEL) is a digital 0 signal.

Figure 5B:
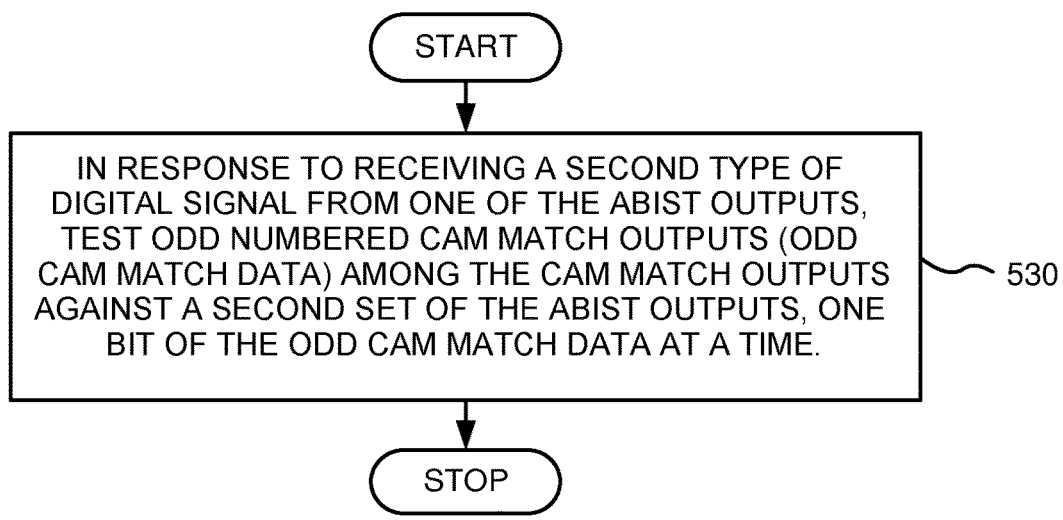
FIG. 5B depicts a flowchart in accordance with a further embodiment of the present invention.

Referring to FIG. 5B, the method further includes an operation 530 of, in response to receiving a second type of digital signal from one of the ABIST outputs, testing odd numbered CAM match outputs (odd CAM match data) among the CAM match outputs against a second set of the ABIST outputs, one bit of the odd CAM match data at a time. In an embodiment, the second type of digital signal from the one of the ABIST outputs is a digital 1 signal. In an embodiment, MISR 100 performs operation 530 of, in response in response to receiving a second type of digital signal from one of the ABIST outputs (e.g., ABIST_PORT_SEL), testing odd numbered CAM match outputs (odd CAM match data) (e.g., dout(i+1), dout(i+3), dout(i+5)) among the CAM match outputs against a second set of the ABIST outputs (e.g., si1(*i*), si1(*i*+1), si1(*i*+2)), one bit of the odd CAM match data at a time. In an embodiment, the second type of digital signal from the one of the ABIST outputs (e.g., ABIST_PORT_SEL) is a digital 1 signal.

Figure 5C:
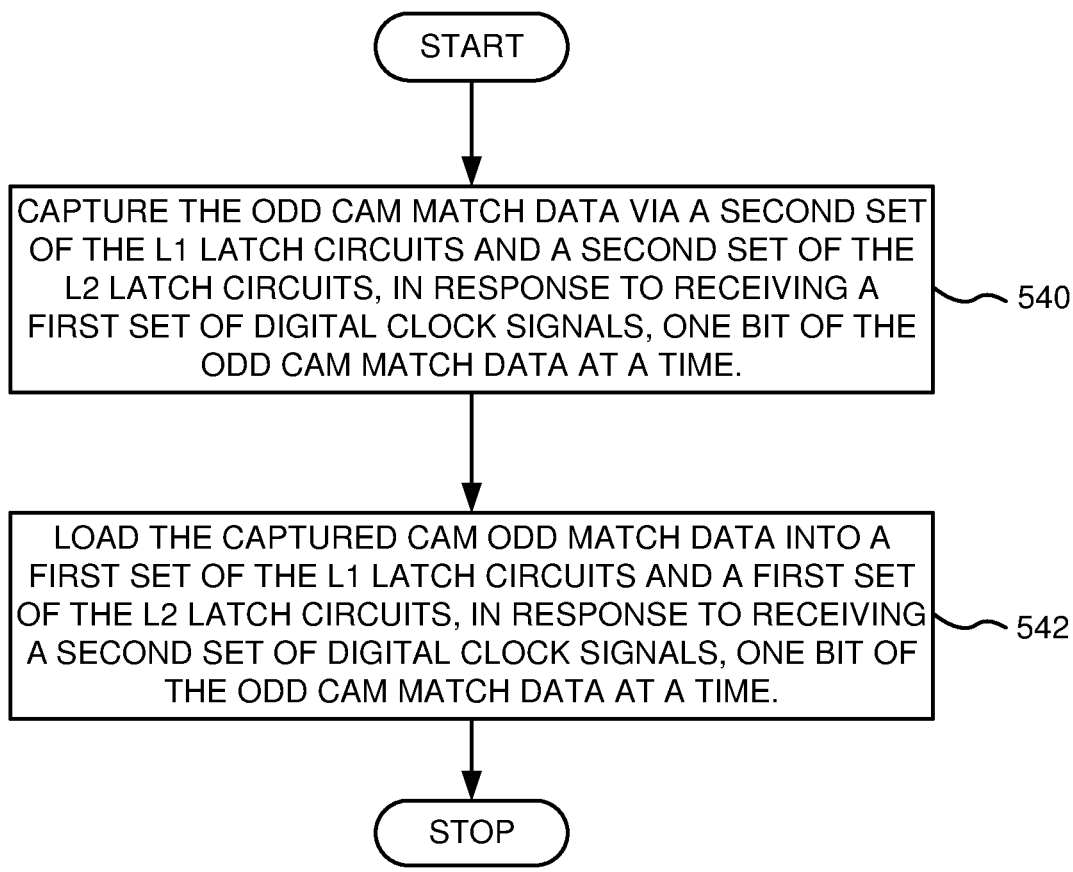
FIG. 5C depicts a flowchart in accordance with a further embodiment of the present invention.

Referring to FIG. 5C, in a further embodiment, testing operation 530 includes an operation 540 of capturing the odd CAM match data via a second set of the L1 latch circuits and a second set of the L2 latch circuits, in response to receiving a first set of digital clock signals, one bit of the odd CAM match data at a time and an operation 542 of loading the captured CAM odd match data into a first set of the L1 latch circuits and a first set of the L2 latch circuits, in response to receiving a second set of digital clock signals, one bit of the odd CAM match data at a time. In an embodiment, MISR 100 performs operation 540 of capturing the odd CAM match data (e.g., dout(i+1), dout(i+3), dout(i+5)) via a second set of the L1 latch circuits 116, 118, 119 and a second set of the L2 latch circuits 126, 128, 129, in response to receiving a first set of digital clock signals, one bit of the odd CAM match data at a time. In an embodiment, MISR 100 performs operation 542 of loading the captured CAM odd match data (e.g., dout(i+1), dout(i+3), dout(i+5)) into a first set of the L1 latch circuits 110, 112, 114 and a first set of the L2 latch circuits 120, 122, 124, in response to receiving a second set of digital clock signals, one bit of the odd CAM match data at a time.

In an exemplary embodiment, testing operation 530 includes an operation 540 of capturing the odd CAM match data via a second set of the L1 latch circuits and a second set of the L2 latch circuits, in response to receiving a first set of digital clock signals, one bit of the odd CAM match data at a time and an operation 542 of loading the captured CAM odd match data into a first set of the L1 latch circuits and a first set of the L2 latch circuits, in response to receiving a second set of digital clock signals, one bit of the odd CAM match data at a time. In an embodiment, MISR 100 performs operation 540 of capturing the odd CAM match data (e.g., dout(i+1), dout(i+3), dout(i+5)) via a second set of the L1 latch circuits 116, 118, 119 and a second set of the L2 latch circuits 126, 128, 129, in response to receiving a first set of digital clock signals, one bit of the odd CAM match data at a time. In an embodiment, MISR 100 performs operation 542 of loading the captured CAM odd match data (e.g., dout(i+1), dout(i+3), dout(i+5)) into a first set of the L1 latch circuits 110, 112, 114 and a first set of the L2 latch circuits 120, 122, 124, in response to receiving a second set of digital clock signals, one bit of the odd CAM match data at a time.

In an embodiment, the first set of digital clock signals are generated in response to MISR 100 receiving a second type of digital signal from one of the ABIST outputs (e.g., ABIST_PORT_SEL). In an embodiment, the second set of digital clock signals are generated in response to MISR 100 receiving a second type of digital signal from one of the ABIST outputs (e.g., ABIST_PORT_SEL). In an embodiment, MISR 100 generates the first set of digital clock signals via digital clock circuitry. In an embodiment, MISR 100 generates the second set of digital clock signals via digital clock circuitry. In an embodiment, the second type of digital signal from the one of the ABIST outputs (e.g., ABIST_PORT_SEL) is a digital 0 signal.

Even CAM Match Data and Odd CAM Match Data

Figure 6:
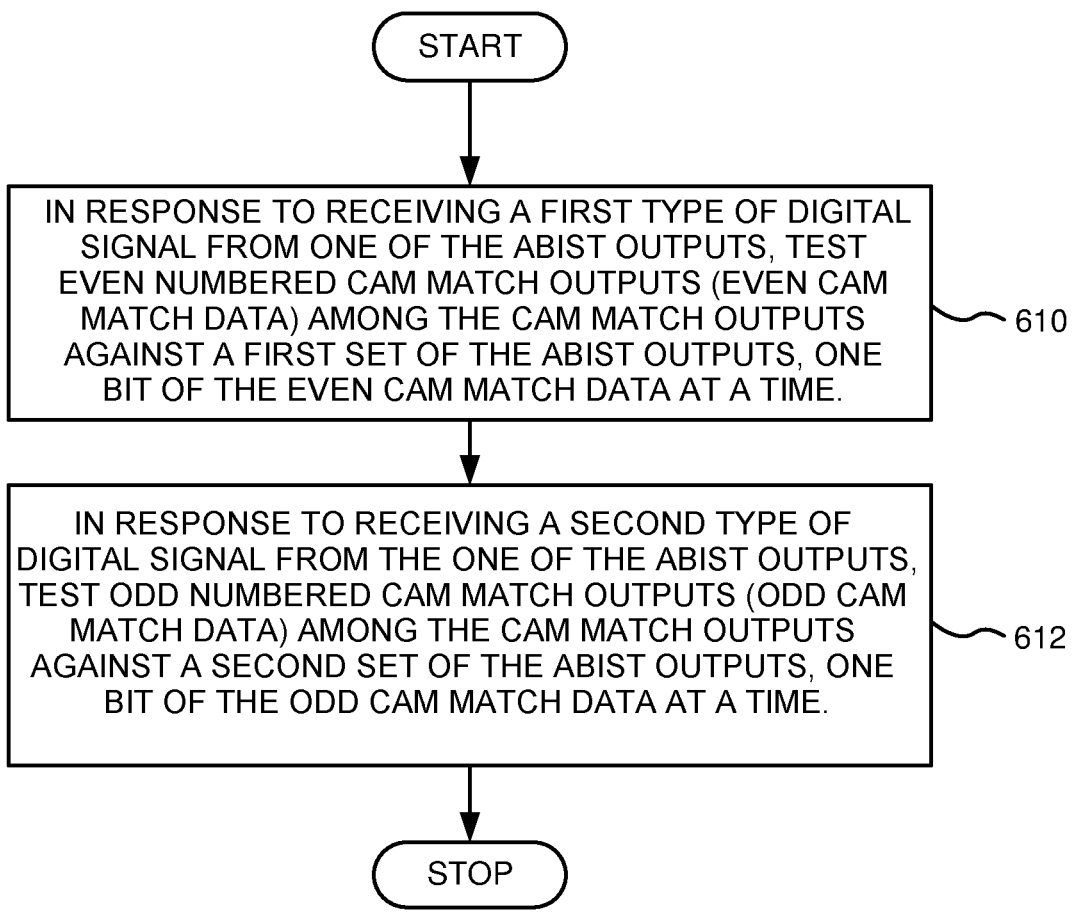
FIG. 6 depicts a flowchart in accordance with an alternative embodiment of the present invention.

Referring to FIG. 6, the method further includes an operation 610 of, in response to receiving a first type of digital signal from one of the ABIST outputs, testing even numbered CAM match outputs (even CAM match data) among the CAM match outputs against a first set of the ABIST outputs, one bit of the even CAM match data at a time and an operation 612 of, in response to receiving via the MUX circuits a second type of digital signal from the one of the ABIST outputs, testing odd numbered CAM match outputs (odd CAM match data) among the CAM match outputs against a second set of the ABIST outputs, one bit of the odd CAM match data at a time. In an embodiment, the first type of digital signal from the one of the ABIST outputs is a digital 0 signal. In an embodiment, MISR 100 performs operation 610 of, in response to receiving a first type of digital signal from one of the ABIST outputs (e.g., ABIST_PORT_SEL), testing even numbered CAM match outputs (even CAM match data) (e.g., dout(i), dout(i+2), dout(i+4)) among the CAM match outputs against a first set of the ABIST outputs (e.g., si0(i), si0(i+1), si0(i+2)), one bit of the even CAM match data at a time. In an embodiment, the first type of digital signal from the one of the ABIST outputs (e.g., ABIST_PORT_SEL) is a digital 0 signal.

In an embodiment, the second type of digital signal from the one of the ABIST outputs is a digital 1 signal. In an embodiment, MISR 100 performs operation 612 of, in response to receiving a second type of digital signal from one of the ABIST outputs (e.g., ABIST_PORT_SEL), testing odd numbered CAM match outputs (odd CAM match data) (e.g., dout(i+1), dout(i+3), dout(i+5)) among the CAM match outputs against a second set of the ABIST outputs (e.g., si1(i), si1(i+1), si1(i+2)), one bit of the odd CAM match data at a time. In an embodiment, the second type of digital signal from the one of the ABIST outputs (e.g., ABIST_PORT_SEL) is a digital 1 signal.

In an exemplary embodiment, testing operation 610 includes capturing the even CAM match data via a first set of the L1 latch circuits and a first set of the L2 latch circuits, in response to receiving a first set of digital clock signals, one bit of the even CAM match data at a time and an operation 442 of loading the captured even CAM match data into a second set of the L1 latch circuits and a second set of the L2 latch circuits, in response to receiving a second set of digital clock signals, one bit of the even CAM match data at a time. In an embodiment, MISR 100 captures the even CAM match data (e.g., dout(i), dout(i+2), dout(i+4)) via a first set of the L1 latch circuits 110, 112, 114 and a first set of the L2 latch circuits 120, 122, 124, in response to receiving a first set of digital clock signals, one bit of the even CAM match data at a time. In an embodiment, MISR 100 loads the captured even CAM match data (e.g., dout(i), dout(i+2), dout(i+4)) into a second set of the L1 latch circuits 116, 118, 119 and a second set of the L2 latch circuits 126, 128, 129, in response to receiving a second set of digital clock signals, one bit of the even CAM match data at a time.

In an embodiment, the first set of digital clock signals are generated in response to MISR 100 receiving a first type of digital signal from one of the ABIST outputs (e.g., ABIST_PORT_SEL). In an embodiment, the second set of digital clock signals are generated in response to MISR 100 receiving a first type of digital signal from one of the ABIST outputs (e.g., ABIST_PORT_SEL). In an embodiment, MISR 100 generates the first set of digital clock signals via digital clock circuitry. In an embodiment, MISR 100 generates the second set of digital clock signals via digital clock circuitry. In an embodiment, the first type of digital signal from the one of the ABIST outputs (e.g., ABIST_PORT_SEL) is a digital 0 signal.

In an exemplary embodiment, testing operation 612 includes capturing the odd CAM match data via a second set of the L1 latch circuits and a second set of the L2 latch circuits, in response to receiving a first set of digital clock signals, one bit of the odd CAM match data at a time and an operation 542 of loading the captured CAM odd match data into a first set of the L1 latch circuits and a first set of the L2 latch circuits, in response to receiving a second set of digital clock signals, one bit of the odd CAM match data at a time. In an embodiment, MISR 100 captures the odd CAM match data (e.g., dout(i+1), dout(i+3), dout(i+5)) via a second set of the L1 latch circuits 116, 118, 119 and a second set of the L2 latch circuits 126, 128, 129, in response to receiving a first set of digital clock signals, one bit of the odd CAM match data at a time. In an embodiment, MISR 100 loads the captured CAM odd match data (e.g., dout(i+1), dout(i+3), dout(i+5)) into a first set of the L1 latch circuits 110, 112, 114 and a first set of the L2 latch circuits 120, 122, 124, in response to receiving a second set of digital clock signals, one bit of the odd CAM match data at a time.

In an embodiment, the first set of digital clock signals are generated in response to MISR 100 receiving a second type of digital signal from one of the ABIST outputs (e.g., ABIST_PORT_SEL). In an embodiment, the second set of digital clock signals are generated in response to MISR 100 receiving a second type of digital signal from one of the ABIST outputs (e.g., ABIST_PORT_SEL). In an embodiment, MISR 100 generates the first set of digital clock signals via digital clock circuitry. In an embodiment, MISR 100 generates the second set of digital clock signals via digital clock circuitry. In an embodiment, the second type of digital signal from the one of the ABIST outputs (e.g., ABIST_PORT_SEL) is a digital 0 signal.

Example

For example, MISR 100 may receive an ABIST_MISR_ACT digital signal, where an ABIST_PORT_SEL output of the ABIST circuit generates ABIST_PORT_SEL_0 (a logical 0 on ABIST_PORT_SEL output) and ABIST_PORT_SEL_1 (a logical 1 on the ABIST_PORT_SEL output). The ABIST_PORT_SEL_0 and the ABIST_PORT_SEL_1 control the capturing of the even CAM match data and the odd CAM match data. Also, the MISR receives a first set of digital clock signals and a second set of digital clock signals, leading to the testing of the even CAM match data and the odd CAM match data. When ABIST_PORT_SEL equals 0, MISR 100 captures the even CAM match data via even latches 110, 112, 114, 120, 122, 124 during one clock cycle and loads the captured even CAM match data into odd latches 116, 118, 119, 126, 128, 129 during the next clock cycle, in a MISR mode. When ABIST_PORT_SEL equals 1, MISR 100 captures the odd CAM match data via odd latches 116, 118, 119, 126, 128, 129 during one clock cycle and loads the captured odd CAM match data into even latches 110, 112, 114, 120, 122, 124 during the next clock cycle, in a MISR mode.

For example, with inputs to the L1 latches being CAM match data, a compare mask/compare mask circuit 197 can force a match on all other bits of CAM 180 except one row such that a MATCH value is controlled for one CAM bitcell of CAM 180 for each of the memory columns CAM 180 (e.g., 64 columns). A MATCH equals 1 is performed between a compare data bit and the bitcell contents of CAM 180; thereafter, a mis-MATCH equals 0 is performed. Even latches 110, 112, 114, 120, 122, 124 capture the MATCH<0, 2, 4 . . . > on a first clock cycle, and then, on the next cycle, the first set of data from the even MATCH<0, 2, 4 . . . > is loaded into adjacent odd latches 116, 118, 119, 126, 128, 129 in a MISR mode, such that this process continues incrementing up each row of CAM 180 by loading the even columns of CAM 180 and then compressing the data into the odd columns. Odd latches 116, 118, 119, 126, 128, 129 capture the MATCH<1, 3, 5 . . . > on a first clock cycle, and then, on the next clock cycle, the first set of data from the odd MATCH<1, 3, 5 . . . > is loaded into adjacent even latches 110, 112, 114, 120, 122, 124 in a MISR mode, such that this process continues incrementing up each row of CAM 180 by loading the odd columns of CAM 180 and then compressing the data into the even columns.

The full operation of the present invention could begin with flipping the array contents, such that if the MATCH was with the array contents equals 0, then process could be performed with the array contents equals 1. When all the cycles of the present invention are complete, then the compressed MISR result could be scanned out of MISR 100.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A system comprising:
a multiple input signature register (MISR), wherein the MISR is logically coupled to digital outputs of a content addressable memory (CAM) (CAM match outputs), is logically coupled to digital inputs of a random access memory (RAM) (RAM inputs), and is logically coupled to digital outputs of an array built-in self-test (ABIST) controller circuit (ABIST outputs);
wherein the MISR comprises a plurality of L1 latch circuits logically coupled to a plurality of L2 latch circuits, a plurality of multiplexer (MUX) circuits logically coupled to the plurality of L1 latch circuits, a plurality of exclusive or (XOR) circuits (inner XOR circuits) logically coupled to the plurality of MUX circuits and to the plurality of L2 latch circuits, and at least two XOR circuits (outer XOR circuits), wherein each of the outer XOR circuits is logically coupled to one of the inner XOR circuits, to at least one of the MUX circuits, and to at least one of the L2 latch circuits,
wherein each of the L1 latch circuits comprises a first data input, a first scan input, and a first output, and
wherein each of the L2 latch circuits comprises a second data input, a second scan input, and a second output;
wherein the MISR is logically configured to receive the CAM match outputs on the first data inputs of the L1 latch circuits;
wherein the MISR is logically configured to address the RAM via the first outputs of the L1 latch circuits and the RAM inputs;
wherein the MISR is logically configured to receive the ABIST outputs via the MUX circuits and the inner XOR circuits on the first scan inputs of the L1 latch circuits;
wherein the MISR is logically configured to output compression data (L2 scan out data) via the second outputs of the L2 latch circuits; and
wherein the MISR is logically configured to provide feedback data via the outer XOR circuits;
wherein the CAM is logically coupled to a compare mask circuit, and
wherein the compare mask circuit is logically configured to direct the CAM to output one bit of the CAM match outputs at a time;
wherein the MISR is further logically configured, in response to receiving a digital control input signal, to address the RAM via the first outputs of the L1 latch circuits and the RAM inputs and via CAM match wordlines on the first outputs of the L1 latch circuits, wherein the CAM match wordlines correspond to the CAM match outputs;
wherein the MISR is further logically configured, in response to receiving a first type of digital signal from one of the ABIST outputs, to test even numbered CAM match outputs (even CAM match data) among the CAM match outputs against a first set of the ABIST outputs; and wherein the MISR is further logically configured, in response to receiving a second type of digital signal from one of the ABIST outputs, to test odd numbered CAM match outputs (odd CAM match data) among the CAM match outputs against a second set of the ABIST outputs.

* * * * *